Figure 1:
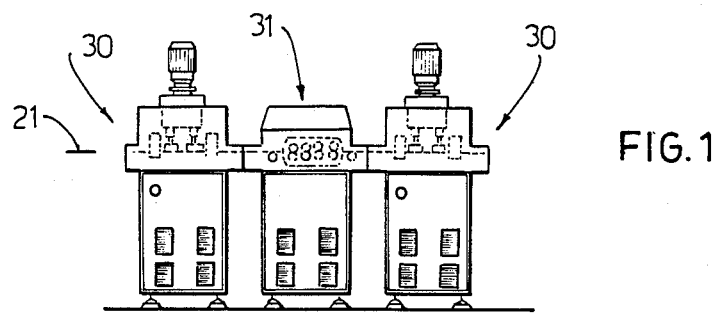

United States Patent [19]

Pola et al.

[11] Patent Number: 4,854,081
[45] Date of Patent: Aug. 8, 1989

[54] DEVICE FOR TREATING PRINTED CIRCUIT BOARDS, IN PARTICULAR FOR PUMICING AND TRIMMING

[75] Inventors: Carlo Pola; Giacinto Massa, both of Ovada, Italy

[73] Assignee: Pola E Massa S.N.C. Di Pola C. E M. & Massa G., Ovada, Italy

[21] Appl. No.: 165,167

[22] Filed: Mar. 11, 1988

[30] Foreign Application Priority Data

Mar. 13, 1987 [IT] Italy .................................. 19706 A/87

[51] Int. Cl.$^4$ ............................ B24B 7/00; B24B 9/00
[52] U.S. Cl. ..................................... 51/76 R; 51/81 R; 51/125.5; 51/283 R; 125/16 R; 125/35; 198/379
[58] Field of Search ................. 51/110, 125.5, 317, 51/318, 326, 51, 31, 34 R, 34 C, 74 R, 78, 81 R, 56 R, 215 E, 283 R, 76 R; 125/13 R, 16, 35; 198/379

[56] References Cited

U.S. PATENT DOCUMENTS

| | | | |
|---|---|---|---|
| 2,080,198 | 5/1937 | Brandenburg | 51/110 |
| 2,666,282 | 1/1954 | Peterson | 51/318 |
| 4,699,564 | 10/1987 | Cetrangolo | 125/35 |

Primary Examiner—Frederick R. Schmidt
Assistant Examiner—Maurina Rachuba
Attorney, Agent, or Firm—Young & Thompson

[57] ABSTRACT

The proposed device comprises a treatment unit (30) substantially made up of a feed guide (6) for the board and one or more rotating brushes (5) having their axes of rotation perpendicular to the board; this unit is followed by a flip-over assembly (31) and then by a second treatment unit (30) identical to the first. The treatment liquid reaches the center of each brush (5) through a duct. The brush assembly moves transversely; in addition each brush can have an orbital movement. The flip-over assembly (31) consists of a series of facing drive roller parts (34) mounted on a carriage (32) that can be rotated at 180° around an axis (33). These rollers (34) are such that they can rotate in two different directions.

7 Claims, 4 Drawing Sheets

DEVICE FOR TREATING PRINTED CIRCUIT BOARDS, IN PARTICULAR FOR PUMICING AND TRIMMING

The present invention concerns a machine for treating one or both surfaces of thin flexible or rigid printed circuit boards in order to pumice them, as well as trimming their holes if necessary.

At present these boards are usually treated by jet cleaning with a suspension of water and pumice and said jet exerting an abrasive action on the board.

This process causes severe damage through wear on the spray nozzles and pumps, which generally results in high costs.

For trimming in the holes use is also made of machines equipped with abrasive cylindrical brushes having a rotation axis parallel to the supporting base of the board and perpendicular to the feed direction of the board.

This type of brush exerts its abrasive action in one direction only; this often causes ovalization of the holes, making subsequent working of the board inaccurate and difficult.

In particular the U.S. Pat. No. 3,691,582 patent describes a machine for cleaning printed circuit boards where scrubbing brushes having a reciprocating orbital motion, pass on one surface of the boards to be treated. Said machine, however, is able to carry out only the brushing of the holes in the boards and not their trimming; in addition, this machine cannot be used for pumicing since it is not equipped with a device for continously washing the conveyor belt (the crumbs of pumice which are formed, if not continously taken away, may damage the conveyor rollers). Lastly, the abrasive liquid, which can be used, evaporizes during its working, which would block the bearings and the sliding supports of the machine.

Furthermore most parts of the machine on the market are able to carry out the treatment of only one face of the boards; moreover devices are known able to rotate a substantially flat object with respect to a vertical axis perpendicular to the object so as to allow the processing of the different sides of the object. This type of device is disclosed in the JP No. 60-188215 patent, which is useful in the processing of sides and corners of tiles.

Another machine is known, described in the JP No. 59-232756 patent which is able to turn over the object to be treated with respect to a horizontal axis, placed transversally with respect to the feed direction of the object, so as to allow the working of the opposite edges of said object. This turn-over device is made up of a turn-over wheel which is set in the path of the boards. The wheel is equipped with grids for receiving the object which is introduced and withdrawn by means placed outside the turn over device. This causes a great difficulty for moving the objects and prevents in any case the use of the machine also in case that the turning-over is not required.

From the U.S. Pat. No. 3,939,514 a machine for the simultaneous treatment of both faces of wafer disks is known. This machine foresees placing said faces vertically and sliding them between two guides, properly shaped, whereas a series of a pair of brushes able to rotate in the same direction or according to two-by-two alternate directions simultaneously treat them on both sides. It is clear that such a machine is able to treat only circular boards which are made to rotate because otherwise the washing or smoothing treatment is not uniform in the upper or lower portions of the board.

The object of the present invention is to carry out a highly efficient device for pumicing printed circuit boards on one or on both sides, said board being of any shape.

Another object is to exert an extremely uniform abrasive action on the boards, so as to avoid the ovalisation of the holes.

A further object is to create a device that can be used for different board tratments, for example also for trimming the holes contained in them.

Yet another object is to permit use of boards that are very thin and therefore flexible.

The main object has been achieved with a device comprising a treatment unit, essentially composed of a guide to feed the board and one or more brushes which move on the surface of the board, followed by a turn-over assembly consisting of a carriage rotating around an axis contained in the sliding surface of the boards and perpendicular to the motion direction on which carriage means for moving the board are provided, said means being movable in two opposite directions.

The pumicing liquid is preferably delivered to the centre of the brushes by means of a through hole in the shaft which transmits motion to the brushes.

The brushes are preferably supported by a bearing block which is moved perpendicularly with respect to the axes of rotation of the brushes and to the feed direction of the board.

The hollow shaft arrangement makes it possible for the liquid to leave the brush by centrifugal force, covering the entire area of contact between brush and board; in this way optimum use of the liquid is achieved.

The abrasive action of the brushes in their rotary translational movement does not lead to ovalisation of the holes in the boards as it would be the case if the movement were translational only (radial stress) or rotatory only (tangential stress). The brushes are preferably arranged in parallel rows which are preferably offset with respect to one another.

In a preferred embodiment each brush rotates in the opposite direction to that of its adjacent brushes.

The board feed guide is preferably a conveyor belt.

If the board to be treated is particularly thin, a guide plate with holes at the brushes is placed between said brushes and the board, so that the board does not buckle under stress.

For pumicing, the brushes are preferably of nylon and a rotation speed of about 500-600 r.p.m. is provided.

For trimming perforated boards, the brushes are preferably of abrasive nylon (tynex brushes) and a rotation speed of about 2800 r.p.m. is provided.

A device according to the present invention may be equipped with a plurality of brush holder blocks of different types according to the surface treatment they have to perform on the board.

In another preferred embodiment the brushes have an offset fixing hole so that their rotation is of an orbital type.

The turn-over assembly may be made up of two rows of drive rollers integral with a carriage rotating of 180° around an horizontal axis placed on the feed plane of the board transversally with respect to the feed direction, it being possible to automatically invert the direction of rotation of said rollers whenever the carriage rotates for an angle of 180°, or to let the board pass without turning it over.

Figure 2:
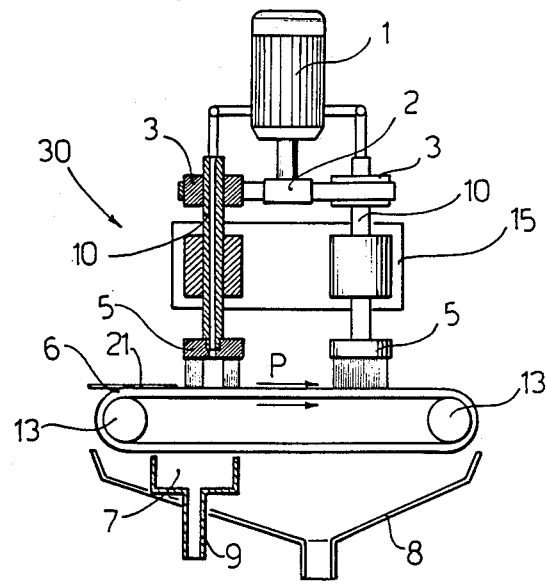
Figure 3:
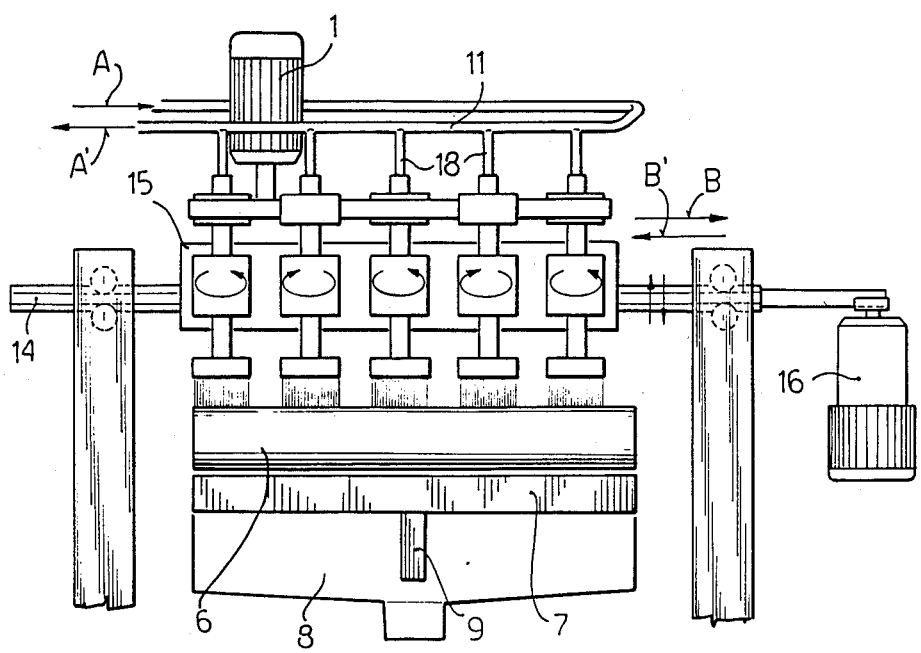
Figure 3A:
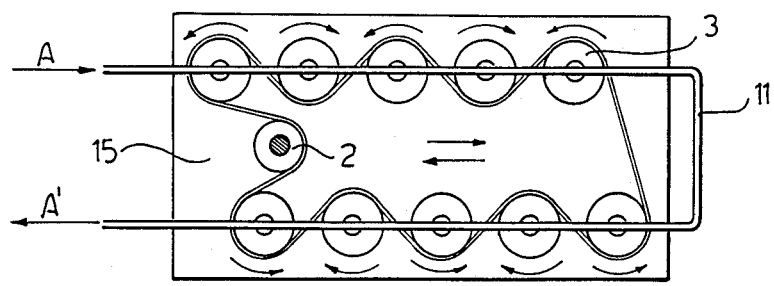
Figure 4:
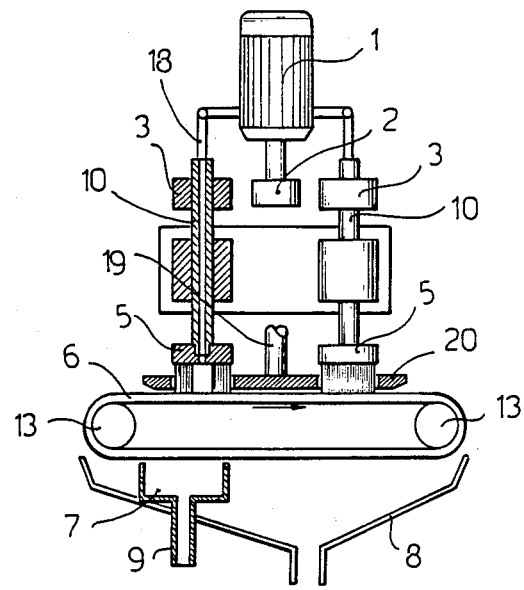
Figure 5:
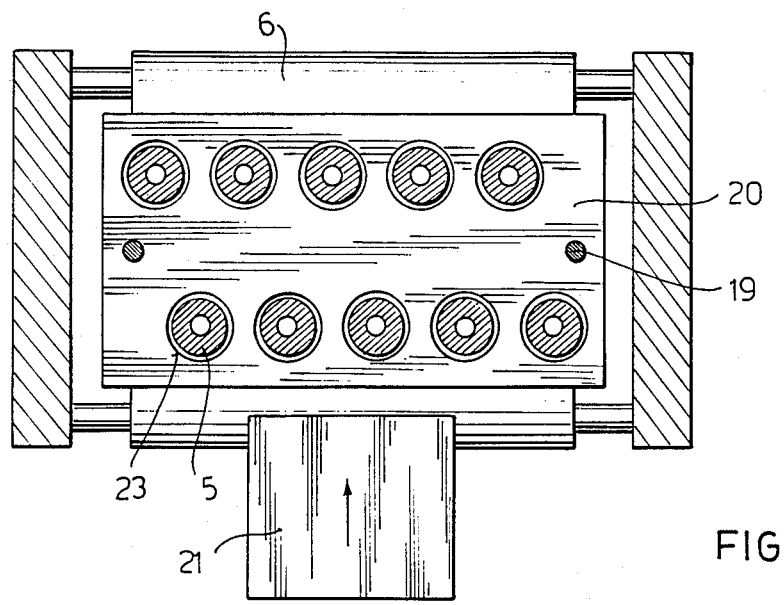
Figure 6:
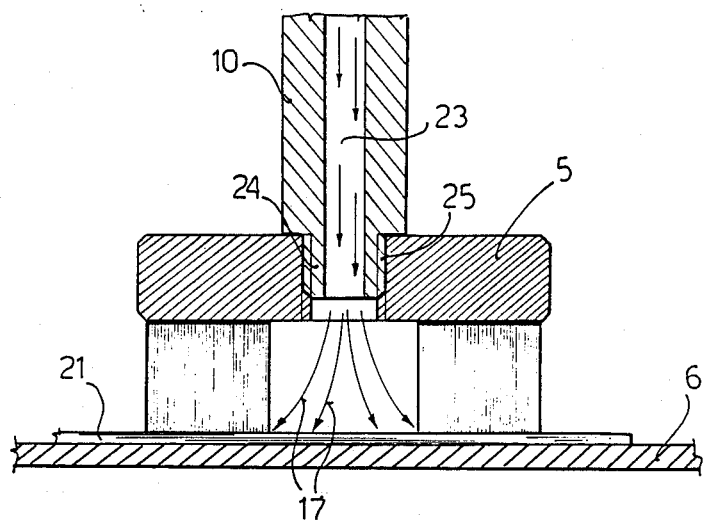
Figure 6A:
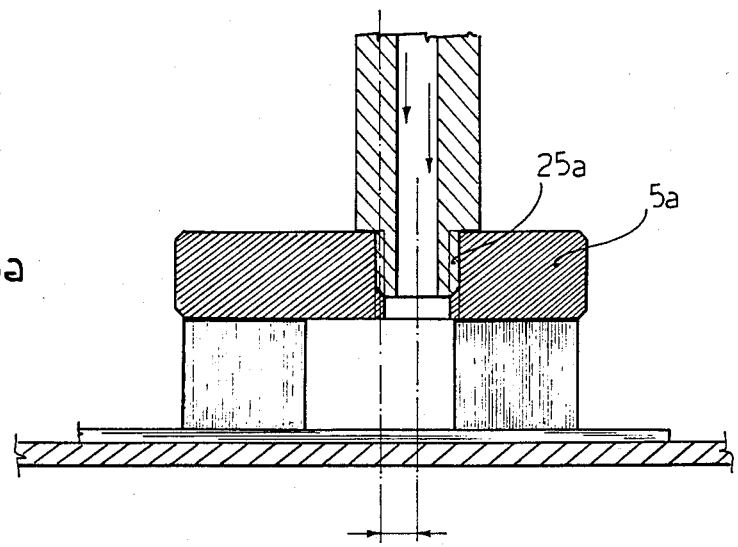
Figure 7:
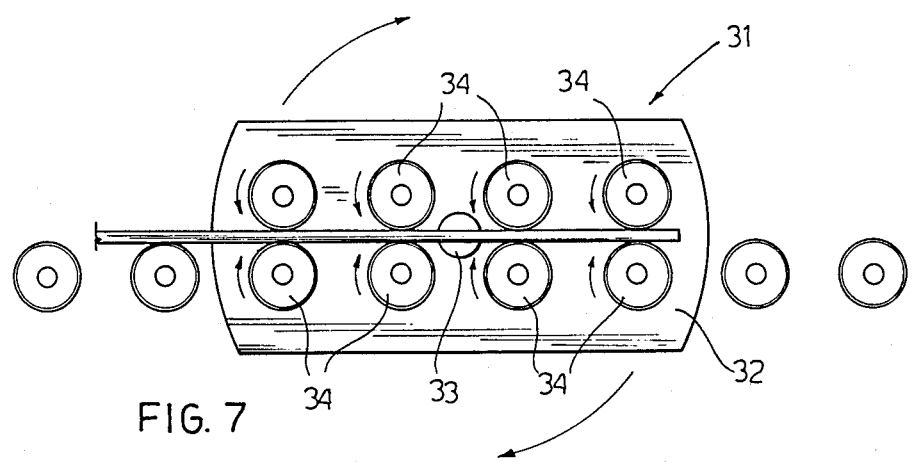
Figure 7A:
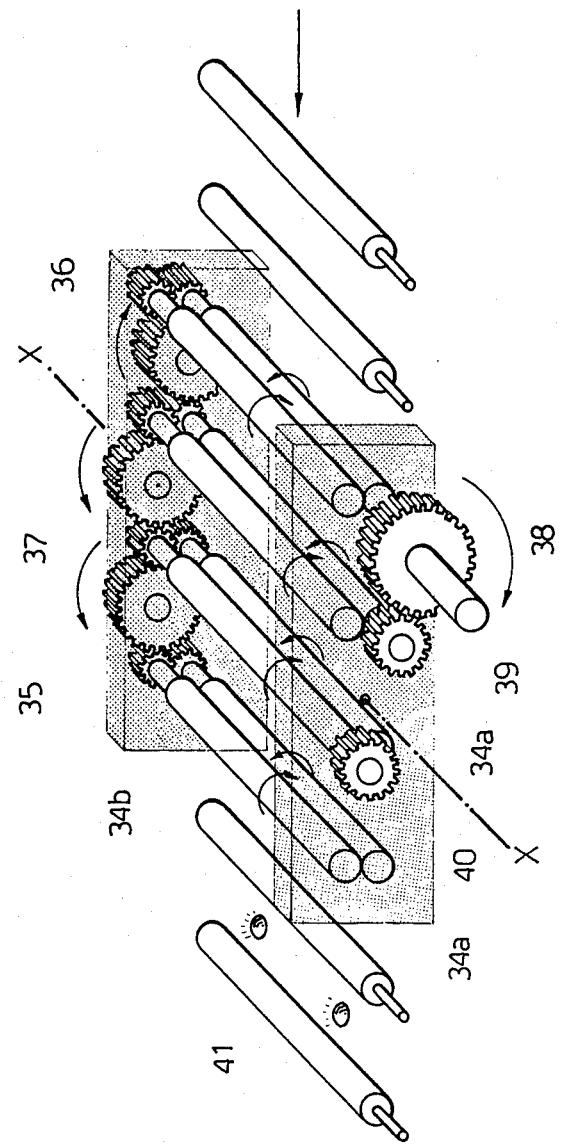

Preferred embodiments of the present invention ae illustrated in the attached drawings wherein:

FIG. 1 shows an overall view of the proposed device;
FIG. 2 shows a part sectional view of a treatment unit;
FIG. 3 shows a front view of the device in FIG. 2;
FIG. 3a shows a plan view of FIG. 3;
FIG. 4 shows a part sectional side of a different embodiment;
FIG. 5 shows a top view of a horizontal section along the plane of the brushes in the device shown in FIG. 4;
FIGS. 6 and 6a both show a section of a brush according to two possible variations;
FIGS. 7 and 7a show in a lateral view and in a prospective view respectively the turn-over assembly in FIG. 1.

FIG. 1 shows the proposed device comprising two treatment units 30 between which a turn-over assembly 31 is provided.

In FIGS. 2, 3 and 3a a treatment unit 30 is shown in which the printed circuit boards 21 move in the direction of the arrow P.

Each unit comprises a conveyor belt 8, supported by two rotating shafts 13 to feed the board 21 which rests on said belt, and a brush holder block that supports a group of circular brushes 5 with their vertical axis perpendicular to the sliding plane of the belt 6 and thus also perpendicular to the printed circuit boards 21.

The brushes 5 are arranged in two parallel, offset rows (FIG. 4).

The brushes are driven by a motor 1 and rotate in the direction of the arrows, i.e. clockwise and anticlockwise alternately.

The rotary movement is transmitted to the brushes by pulley coupling 2 and 3 (FIG. 3a).

It is foreseen that the brush holder shaft 10 should be hollow so as to permit the flow of a liquid (water-pumice) necessary for the process (cleaning, trimming or other).

Said liquid flows in the direction of arrows A-A' through a U-shaped pipe on the arms 11 of which distributor ducts 18 are set, which deliver the liquid to the hollow shafts 10.

The liquid reaches the centre of the circular crown of the brushes 5 through the shafts 10 and leaves the brushes (arrows 17 FIG. 6) by centrifugal force, covering the entire area of contact between brush and board.

A tank 8 is placed under the belt 6 for discharging used liquid, whereas a tank 7 with a waste pipe 0 is provided to collect the water used to wash the belt.

Simultaneously with the rotary movement of the brushes, a geared motor 16 operates the brush holder block 15 by translating the mobile shafts 14 integral with the block perpendicularly to the feed direction of the board (arrows B-B' in FIG. 3).

FIGS. 4 and 5 show a machine that differs from the one in FIGS. 2 and 3 in that, for cleaning a very thin flexible board a guide plate 20 is provided which is positioned, by means of transport pins 19, which prevent its displacement between the board 21 feeding on the conveyor belt 6 and the brush holder block, said plate 20 having circular holes 22 which permit contact between the brushes 5 and the printed circuit board 21.

FIG. 6 shows in detail the shaft 10 with a through hole 23 and a narrower end ring 24, onto which the brush 5 is fixed by means of a screw thread 25.

FIG. 6a, on the other hand, shows a brush 5a having an orbital movement. For this purpose the brush is provided with a screw thread 25a that is offset with respect to the axis of the brush.

In FIG. 7 a turn-over assembly 31 is shown, consisting of a series of a pair of facing drive rollers (34) mounted on a carriage 32, that can be rotated at 180° around an axis 33, placed in the sliding plane of the boards 21 and perpendicular to the motion direction P. Said rollers 34 are such that they can rotate in two different directions. FIG. 7a shows in detail the gear system which moves the assembly. The bearing structure 35 supports the pair of rollers 34a and 34b, the coupling of which is carried out by means of gears 36 whereas the motion is transmitted from the gears 37 placed within the pair of adjacent gears 36. In the lower part of the device the drive gear 38 is visible, always in rotation with a free wheel. Two coupling gears 39 for the 34a lower rollers and 40 for the 34b upper rollers, engage alternatively with the gear drive 38 (without crawling thanks to the use of the free wheel) whenever the carriage 35 is rotated.

On the right, FIG. 7a, i.e. in the direction from which the board to be turned over comes, a detecting group 41 is shown consisting of, in particular, two photoelectric cells, said group recording the passage of the board 21, and actuating by means of an encoder the starting of the turn-over assembly once the front part of the board is in correspondence wth the last pair of rollers of the turn-over assembly, regardless of the length of the board.

We claim:

1. Apparatus for treating the surfaces of printed circuit boards comprised of first and second treatment means in series, each said treatment means including at least one row of rotatable brushes, means to feed an abrasive treatment liquid to said brushes, means to convey said printed circuit boards to said first and second treatment means in a manner which permits contact between said brushes of said first and second treatment means and an adjacent surface of said printed circuit boards, means to impart translational movement ot said at least one row of brushes in a direction perpendicular to the direction of conveyance of said printed circuit boards, and means to invert said printed circuit boards positioned between said first and second treatment means, said inverting means comprising a series of opposing rollers, at least some of which are driven, said rollers being mounted on an invertable carriage which is rotatable 180° about an axis perpendicular to and residing within the plane of conveyance of said printed circuit boards to permit a printed circuit board received from said first treatment means to be inverted and passed to said second treatment means.

2. The apparatus of claim 1 wherein two parallel rows of brushes are provided in each treatment means, with said respective rows being offset with respect to one another.

3. The apparatus of claim 1 wherein said brushes are mounted on respective brush holders which brush holders are each connected to said means to impart translational movement to said brushes.

4. The apparatus of claim 1 wherein said brushes rotate about a hollow rotatable shaft through which said abrasive liquid is supplied to said brushes.

5. The apparatus of claim 1 wherein each brush rotates in a direction opposite to that of adjacent brushes.

6. The apparatus of claim 1 wherein said inverting means includes means to sense the passage of a printed circuit board upon said conveyance means.

7. The apparatus of claim 1 wherein said conveyance means comprises a conveyor belt.

* * * * *